United States Patent [19]

Nakasho

[11] 4,204,236
[45] May 20, 1980

[54] SPEAKER DEVICE HAVING A HOLDING MEANS FOR A SUPERMINIATURE TAPE RECORDER

[75] Inventor: Kazuo Nakasho, Hachioji, Japan

[73] Assignee: Olympus Optical Company Limited, Tokyo, Japan

[21] Appl. No.: 898,809

[22] Filed: Apr. 24, 1978

[30] Foreign Application Priority Data

Apr. 5, 1977 [JP] Japan .................................. 52-52390

[51] Int. Cl.² ............................................ G11B 31/00
[52] U.S. Cl. .............................. 360/137; 179/100.11; 455/349
[58] Field of Search ................... 360/137; 179/100.11; 325/352, 355

[56] References Cited

U.S. PATENT DOCUMENTS

| 3,521,010 | 7/1970 | Sato | 360/137 |
|---|---|---|---|
| 3,644,684 | 2/1972 | Tsuji | 179/100.11 |
| 3,916,122 | 10/1975 | Sato et al. | 360/137 |
| 4,064,374 | 12/1977 | Sato | 360/137 |

Primary Examiner—Stuart N. Hecker
Attorney, Agent, or Firm—Toren, McGeady and Stanger

[57] ABSTRACT

A speaker device having a holder means for a superminiature tape recorder comprises an external speaker device and a holding member provided integrally to said external speaker device for automatically holding the tape recorder when the tape recorder is placed on the holding member.

4 Claims, 4 Drawing Figures

SPEAKER DEVICE HAVING A HOLDING MEANS FOR A SUPERMINIATURE TAPE RECORDER

BACKGROUND OF THE INVENTION

1. Field of the Invention

The present invention relates to an external speaker device having a holder means for a superminiature tape recorder.

2. Description of the Prior Art

Recently, various in-pocket-type superminiature tape recorders have been developed and these tape recorders serve not only as a dictating device but also to enjoy music.

However, the whole device is too small to have a speaker, or even with a speaker, it is too small in diameter to enjoy music or the like.

Therefore, in such superminiature tape recorders, it is necessary to provide an external speaker device having a large diameter which is separately connected to the superminiature tape recorder.

These speaker devices, however, are only connected to a tape recorder by means of a lead wire and no attention is paid to engagement of the tape recorder with the speaker device, so that there is a problem in operation when using or moving it.

SUMMARY OF THE INVENTION

An object of the present invention is to solve the above mentioned problem.

Another object of the present invention is to provide an external speaker device having a holder means where a tape recorder is placed so as to automatically fix and easily remove the tape recorder with simple operation.

According to the present invention, a speaker device having a holder means for a superminiature tape recorder comprises an external speaker device and a holding member provided integrally to said external speaker device for automatically holding the tape recorder when the tape recorder is placed on the holding member.

The external speaker device comprises a speaker, a power supply switch, a display lamp for displaying the switched-on state of the device, a volume knob for controlling the volume of the speaker and a tone control knob for controlling the tone of the reproduced sound.

The holding member comprises a base for placing the tape recorder thereon, a fixed plate provided on one side of the base and a movable keep plate provided on the other side of the base for keeping the tape recorder with a holding mechanism.

The holding mechanism comprises an engage member extended in the base from the movable keep plate, a spring provided between the engage member and the base, and a set lever having a projecting member slightly projected from a hole bored in the base for engaging with the movable keep plate and a second spring mounted between a base plate and the lever.

DESCRIPTION OF THE PREFERRED EMBODIMENT

Figure 1:
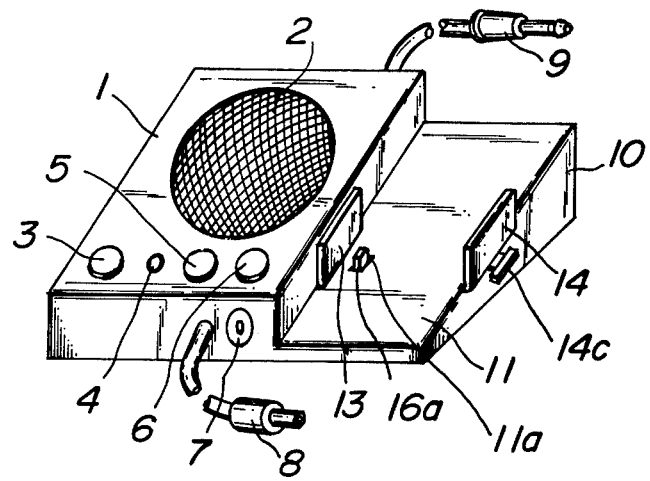
FIG. 1 is a perspective view showing a construction of one embodiment of a speaker device having a holder means for a tape recorder according to the present invention.

Referring now to FIG. 1 one embodiment of a speaker device having a holder means for a tape recorder according to the present invention is shown. As shown in FIG. 1 a main body 1 of a speaker device has an upper surface which is downwardly inclined toward the front side, and which is provided with a speaker 2 having a relatively large diameter, and with a power supply switch 3, a display lamp 4, a volume knob 5 and a tone control knob 6. The front surface of the main body 1 is provided with an input connector 7 and an output connector 8, respectively, while the back surface thereof is provided with a reproducing plug 9. The main body 1 is also integrally provided with a holding portion 10 for holding a superminiature tape recorder on one side surface. The holding portion 10 comprises a base 11 inclined in the same manner as the upper surface of the main body 1, a fixed plate 13 provided on the main body side thereof and an L-shaped movable keep plate 14 provided on the other side. The movable keep plate 14 is given a bias force in the direction of the speaker 2 by means of a spring 15 fixed to an engage member 14b extended in the base 11 from a projected holding member 14a at one end and fixed to the base 11 at the other end.

A set lever 16 engaged with the movable keep plate 14 has a projection member 16a slightly projected from a hole 11a bored in the base 11 and a hook 16b having a bent end attached to the engaging member 14b as shown in FIG. 2. The lever 16 is arranged to vertically move by the action of a spring 18 mounted on a base plate 17 at one end and on a predetermined portion of the lever 16 at the other end.

The holding portion 10 is further provided with a pull knob 14c at the bent portion of the movable keep plate 14 and elastic protection plates 19 such as rubber or the like at the portions, brought into contact with the tape recorder, of the projection member 16a, the movable keep plate 14, the fixed plate 13 and the base 11. The speaker device main body 1 is also provided with a cell portion, an output amplifier circuit and the like (not shown) therein.

Figure 2A:
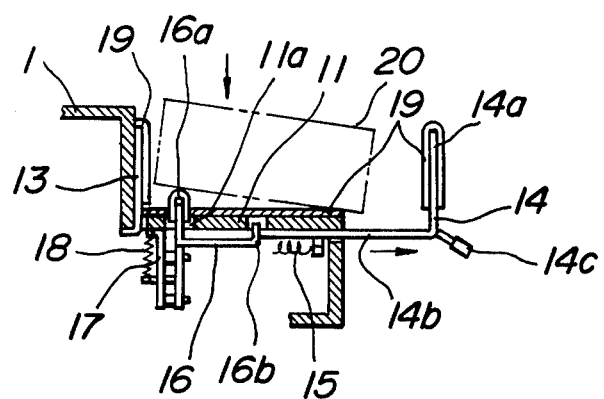
FIGS. 2a and 2b are cross-sectional views of successive stages in the holding operation of the tape recorder.
Figure 2B:
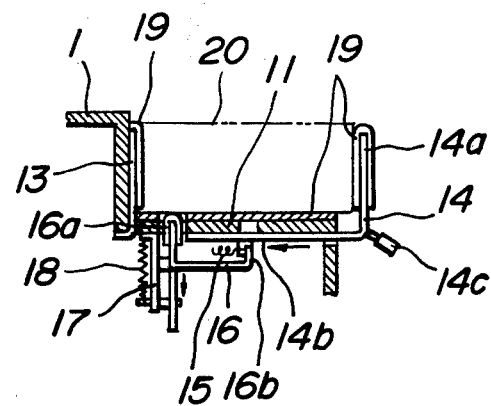

In case of loading a superminiature tape recorder in the thus constructed external speaker device, the movable keep plate 14 is pulled to the position out of the hook 16b by means of the pull knob 14c against the bias force of the spring 15, thereby fully raising the set lever 16 by the action of the spring 18, engaging the engaging member 14b with the hook 16b as shown in FIG. 2a thereby holding the keep plate 14 in the position shown in FIG. 2a even when manually released. With the keep plate 14 in the position shown, the tape recorder 20 is placed on the base 11 is pressed downwardly in the direction of the arrow shown in FIG. 2a, and then the projecting member 16a is pressed downwardly by the tape recorder 20 so as to lower the set lever 16 against the bias force of the spring 18. The hook 16b for preventing the movement of the movable keep plate 14 is, thus, separated from the engaging member 14b, the movable keep plate 14 is moved leftwardly in the direction of the arrow as seen in FIG. 2b by the action of the spring 14, and the tape recorder 20 is sandwiched between the fixed plate 13 and the movable keep plate 14 as shown in FIG. 2b.

Thereafter, the reproducing plug 9 is connected to an output terminal of the tape recorder 20, the connector 8 is connected to the input connector of the tape recorder 20, if necessary, and an output connector from an alternating current source is connected to the connector 7 of the speaker device main body 1. Then, a playing button of the tape recorder 20 is operated to reproduce music or the like recorded in a cassette of the tape recorder 20 through the external speaker device. In this case, the power supply switch 3 of the speaker device should be ON, and the volume, tone and the like of a reproduced sound can freely be adjusted by turning the knobs 5 and 6.

On the other hand, in case of removing the tape recorder 20 from the holding portion 10, after releasing the connection of the electric system of the tape recorder, the knob 14c is pulled to the position where the engage member 14b of the movable keep plate 14 releases the hook 16b whereby the set lever 16 pushes the tape recorder 20 upwardly by the action of the spring 18, and the movable keep plate 14 is maintained in the pulled-out position. In this case, the tape recorder 20 is suspended from the base 11, so that it can easily be removed from the holding portion 10 and thus from speaker device main body 1.

Thus, in case of using the external speaker device, if the tape recorder is simply placed, all the means can integrally be mounted, and the removal thereof can easily be carried out by one touch with a simple handling operation.

Figure 3:
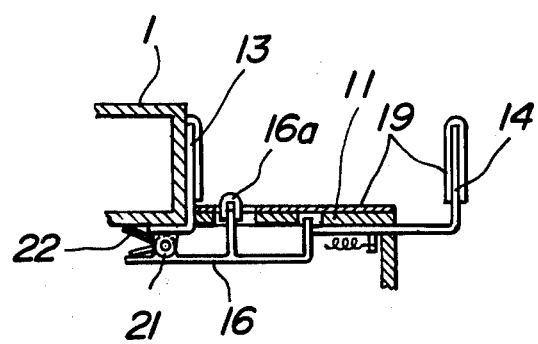
FIG. 3 is a cross-sectional view showing the holding mechanism of another embodiment of the speaker device having holder means for tape recorder according to the present invention.

FIG. 3 shows another embodiment of the present invention, in which the set lever 16 is rotated around a shaft 21, the shaft 21 is wound by a coil spring 22 for giving a restoration force to the set lever 16. In this manner, the function and effect similar to the above embodiment can be performed in a simple construction.

As described in detail, according to the present invention, in case of using the tape recorder by connecting it with the external speaker device, the speaker device and the tape recorder can be joined in a simple operation, and they can be moved without difficulty because they are assembled together. Therefore, the present invention can provide a speaker device having high utility.

What is claimed is:

1. A speaker device adapted to have a superminiature tape recorder mounted in operative engagement therewith comprising an external speaker and holding means formed together in an integral unit, said holding means operating to hold a tape recorder placed thereon in operative relationship with said speaker device; said holding means comprising a base for placing the tape recorder thereon, a fixed plate provided on one side of said base, and a movable keep plate provided on the other side of said base for keeping the tape recorder in position; with a holding mechanism being provided, said holding mechanism comprising an engaged member extending into the base from said movable keep plate, a spring provided between the engaged member and the base, and a set lever for engaging with the movable keep plate and including a projection member projecting slightly from a hole bored in the base, with a second spring being mounted between a base plate and the lever.

2. A speaker device adapted to have a superminiature tape recorder mounted in operative engagement therewith comprising an external speaker and holding means formed together in an integral unit, said holding means operating to hold a tape recorder placed thereon in operative relationship with said speaker device; said holding means comprising a base for placing said tape recorder thereon, a fixed plate provided on one side of said base, a movable keep plate provided on the opposite side of said base for holding said tape recorder, and a holding mechanism operatively associated with said keep plate; said holding mechanism comprising an engage member connected with said keep plate and extending into said base, first spring means provided between said engage member and said base for biasing said keep plate into holding engagement with a tape recorder placed on said base, a set lever movable between a first and a second position for holding said keep plate against the force of said first spring means, second spring means biasing said set lever toward said first position into holding engagement with said keep plate, and projection means including a projection member upstanding from said base for engagement by a tape recorder to press said set lever against the force of said second spring means to said second position out of holding engagement with said keep plate.

3. A speaker device according to claim 2 wherein said engage member engages said set lever to hold said set lever in said second position, said keep plate being manually operable to release said set lever to enable said second spring means to move said set lever to said first position and thereby to drive said projection member against a tape recorder on said base member to dislodge said tape recorder from its mounted position and to facilitate removal thereof.

4. A speaker device according to claim 2 wherein said set lever is rotatively mounted for movement between said first and said second positions.

* * * * *

UNITED STATES PATENT OFFICE
CERTIFICATE OF CORRECTION

Patent No. 4,204,236      Dated May 20, 1980

Inventor(s) Kazuo Nakasho

It is certified that error appears in the above-identified patent and that said Letters Patent are hereby corrected as shown below:

In the heading of the Patent [30] should read as follows:

[30] Foreign Application Priority Data

Apr. 25, 1977 [JP]    Japan...............52-52390

Signed and Sealed this

*Twenty-ninth* Day of *July 1980*

[SEAL]

*Attest:*

SIDNEY A. DIAMOND

*Attesting Officer*      *Commissioner of Patents and Trademarks*